United States Patent
Joly et al.

(10) Patent No.: US 6,178,541 B1
(45) Date of Patent: Jan. 23, 2001

(54) PLD/ASIC HYBRID INTEGRATED CIRCUIT

(75) Inventors: Christian Joly, Palo Alto; Simon Dolan, Los Gatos, both of CA (US)

(73) Assignee: LSI Logic Corporation, Milpitas, CA (US)

(*) Notice: Under 35 U.S.C. 154(b), the term of this patent shall be extended for 0 days.

(21) Appl. No.: 09/050,824

(22) Filed: Mar. 30, 1998

(51) Int. Cl.⁷ .................... G06F 17/50; H03K 19/00
(52) U.S. Cl. ................. 716/17; 716/2; 716/16; 716/18
(58) Field of Search .............. 395/500.18; 716/17, 716/16, 18

(56) References Cited

U.S. PATENT DOCUMENTS

| | | | |
|---|---|---|---|
| 5,036,473 | * 7/1991 | Butts et al. | 364/489 |
| 5,197,016 | * 3/1993 | Sugimoto et al. | 364/490 |
| 5,815,405 | * 9/1998 | Baxter | 364/489 |
| 5,825,202 | * 10/1998 | Tavana et al. | 326/39 |
| 5,867,399 | * 2/1999 | Rostoker et al. | 364/489 |
| 5,946,219 | * 8/1999 | Mason et al. | 364/489 |
| 5,983,277 | * 11/1999 | Heile et al. | 709/232 |
| 6,102,964 | * 8/2000 | Tse et al. | 716/18 |

FOREIGN PATENT DOCUMENTS

2318665 * 4/1998 (GB) .................. G06F/17/50

OTHER PUBLICATIONS

D.M. Perkins et al., Teaching ASIC Design with PFPGAs, IEEE International Conference and Exhibit, pp. 271–274, Sep. 1992.*

S.D. Collis, The requirements for a VHDL–based Custom IC, ASIC or FPGA Design Process, IEEE Colloquium on VHDL, pp. 7/1–7/7, Jan. 1993.*

T.Liehe, Two, Two, Two Chips in One, Electronic Engineering Times, p. 34, Sep. 1992.*

* cited by examiner

Primary Examiner—Paul R. Lintz
Assistant Examiner—A. M. Thompson
(74) Attorney, Agent, or Firm—Dewan & Lally L.L.P.

(57) ABSTRACT

An integrated circuit comprised of a customized circuit portion and a programmable logic portion that is interfaced to the customized circuit. The custom circuit and the programmable circuit are fabricated on a common semiconductor substrate to achieve maximum cost savings and performance advantages over implementations in which an external PLD or other programmable device is interfaced to a custom circuit. Suitably, the customized circuit is designed with an ASIC design flow to optimize the performance, power consumption, and size of the customized circuit. In the presently preferred embodiment, the programmable circuit comprises a plurality of programmable logic cells suitably generated by, in one embodiment, a PLD compiler. Ideally, the relative size and placement of said PLD with respect to said customized circuit are selectable during a design phase of said integrated circuit. This provides flexibility in determining how much of an interim device need be devoted to programmable circuitry. Presumably, during earlier stages of the design process, a larger percentage of the device will be devoted to the programmable portion. As the product definition matures, subsequent interim devices contemplated herein require less programmable logic.

15 Claims, 6 Drawing Sheets

PLD/ASIC HYBRID INTEGRATED CIRCUIT

BACKGROUND OF THE INVENTION

1. Field of the Invention

The present invention relates to the field of integrated circuit design and more particularly to a method and device for implementing an application specific integrated circuit (ASIC) through the use of an iterative process in which increasingly greater percentages of the ASIC are implemented in one or more interim devices prior to the completion of the design.

2. Description of the Relevant Art

Integrated circuits have widespread applications in electronic systems of every variety. An integrated circuit is comprised of thousands of transistors fabricated on a monolithic crystalline lattice typically comprised of silicon or other semiconductor material. These plurality of transistors are selectively interconnected through the use of one or more interconnect layers comprised of conductive material to achieve a particular functionality, typically dictated by the application to which the integrated circuit is directed.

For some well-known applications such as the more popular microprocessors and memory devices, a single device is suitable for a large number of applications and a large number of customers. Examples of such so-called commodity integrated circuits includes, among others, x86 microprocessors and memory devices such as dynamic RAM (DRAM) and static RAM (SRAM) devices. Because commodity products can be sold in large quantities to a large number of customers, dedicated mask sets are typically employed in the fabrication of these devices. The relatively large one time or non-recurring engineering costs associated with the design and layout of a complex set of photomasks suitable for fabricating these commodity devices is typically justified by the extremely large number of units over which these non-recurring costs can be spread. In contrast to the commodity products, application specific or customer specific integrated circuits refer to, as their names imply, devices which are customized for the needs of a particular application or a particular customer. Application or customer specific integrated circuits are typically limited in the number of customers or the quantity in which the devices will be sold. Because of the inherently limited markets associated with customer or application specific integrated circuits, non-recurring engineering costs have a more dramatic impact on the per-unit cost of these types of integrated circuits. To combat these relatively higher non-recurring costs associated with customer and application specific integrated circuits (collectively referred to throughout the remainder of this application as ASICs), programmable devices of many varieties have been used for a number of years. In a typical programmable device, a common mask set is used to produce a standardized integrated circuit which can be customized either in the field or at a late stage in the semiconductor fabrication process. By utilizing a common set of photomasks and processing steps, the per-unit cost of programmable integrated circuits is minimized. Programmable integrated circuits, however, are typically unable to maximize the performance and minimize the surface area required to produce a particular integrated circuit function. The sacrifice in performance and increase in surface area (and therefore, per-unit cost) is typically justified for ASICs when the lifetime or total volume of sales expected for a given ASIC is relatively low. In certain applications, however, customers require custom-built integrated circuits and can justify the non-recurring costs associated with the circuits by a large expected net sales volume. Typically, however, the large ASIC customer requires the custom-built circuit to be reduced from a conceptual or behavioral level description to an implemented circuit in silicon in a short period of time. Achieving an adequate turnaround time for the design and implementation of ASICs becomes increasingly harder as the ASIC technology evolves. Because ASIC manufacturing technology is now able to achieve millions of transistors on a single device, the task of designing a suitably complex circuit able to take advantage of this technology requires greater and greater engineering effort and cost. While electronic design automation (EDA) tools have aided in the ability of ASIC designers to reduce the time and cost associated with implementing complex circuits, the evolution or progress of EDA tools has generally failed to keep pace with the ASIC process technology. In other words, while fabrication and manufacturing improvements have enabled ASIC manufacturers to produce increasingly complex and smaller devices, the tools utilized to simplify the design task have not experienced a commensurate improvement. The net result is that ever-increasing pressures are placed on ASIC manufacturer to produce the complex circuits associated with the state-of-the-art devices in a suitable timeframe.

Figure 1:
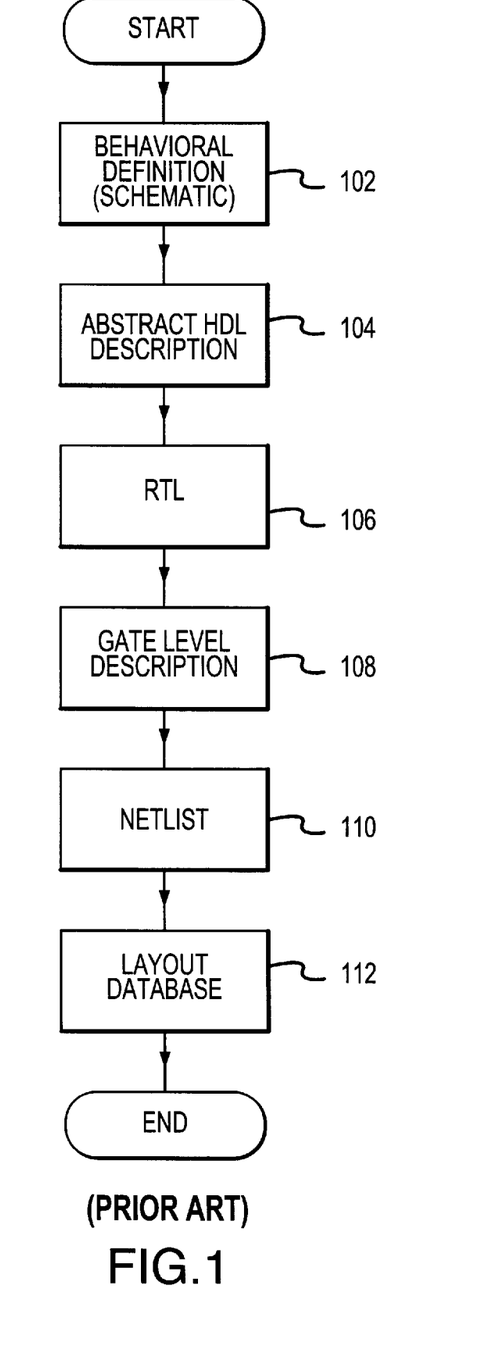
FIG. 1 is a flow diagram of an integrated circuit design process according to the prior art.

Referring to FIG. 1, a simplified block diagram of a conventional ASIC design flow is presented to understand the difficulty in fabricating complex ASICs in a short period of time. Initially, in the process represented in FIG. 1 by reference numeral 102, the behavior of the system in an abstract sense is defined. At this point in the process, the specific implementation of the system is left undefined and the interrelationships among the various circuit elements that will ultimately comprise the system are temporarily ignored in order to achieve a manageable model. At this stage in the process, the design of the ASIC may be entered with a schematic capture editor or other suitable EDA tool. The system designer then typically attempts to describe the behavioral model defined in process step 102 with a hardware description language (HDL) as shown with respect to reference numeral 104. A hardware description language is a highly specialized software language optimized for describing various elements and the interrelationships among the elements of an electronic system. Well-known hardware description languages include, among others, Verilog HDL and VHDL as will be familiar to those skilled in the field of integrated circuit design. After the integrated circuit has been suitably captured in HDL format, a behavioral synthesis tool is typically employed to produce an RTL representation of the ASIC. An RTL description of an integrated circuit represents a lower level of abstraction than the behavioral model without incorporating all of the individual electronic elements that will ultimately comprise the ASIC. An RTL description of an integrated circuit describes the circuit in terms of a plurality of digital registers, clocking circuits, and logic elements that are combined to implement the desired function of the integrated circuit. From the RTL description derived in process step 106, a gate level description of the device is achieved through a gate level synthesis as shown in process step 108. At the gate level, the circuit is described in greater detail than in the RTL description using a combination of common logic gates and circuits such as AND gates, OR gates, XOR gates, counters, adders, and other common logic gates. After a gate level description of the device has been achieved, suitable EDA tools can be employed to produce a netlist consisting of the list of circuit elements required to produce the ASIC and the interconnections among the various elements. From this netlist, suitable place and route programs can be implemented to implement the circuit in an actual physical design that can be achieved with the process technology chosen for the fabrication of the circuit. After the physical design of the device has been produced, a mask set may be generated and the device fabricated. Suitable testing of the device may then begin to verify that the given circuit performs adequately. The simplified flow shown with respect to FIG. 1 is not meant to be representative of every stage of ASIC development but is rather intended to demonstrate the serial nature of the process. It should be further noted that, at each step represented in FIG. 1, various iterations of the process step are typically undertaken to optimize the performance of the circuit. In addition, a variety of simulation tools are available to simulate the circuit at the various levels of abstraction depicted with respect to FIG. 1.

It will be readily appreciated that the design process depicted in FIG. 1 is a serial process in which each successive step is undertaken only after the preceding step is ultimately completed. The serial nature of the conventional ASIC design flow was typically not thought to be problematic at a time when ASIC designs usually involved less than 100,000 transistors. As the circuit density and complexity of ASIC devices has steadily increased, however, it has become increasingly difficult and time consuming to complete each successive step required in the process. For example, in the time when typical ASICs incorporated less than approximately 100,000 transistors, the layout process represented in FIG. 1 by reference numeral 112 in which the circuit elements are given a physical dimension and location within the integrated circuit, was relatively routine. In addition, the time required to verify the behavior of the system using conventional simulation tools at the system definition level required an acceptably low number of iterations and could typically be accomplished within a time frame suitable for getting the device to market quickly. The problem, however, with the serial nature of the conventional ASIC design flow depicted in FIG. 1 is that the designer is unable to fully verify the device until the end of the design process at which time any mistakes in the design will require at least one or more iterations of the entire cycle. Moreover, as the complexity of ASIC devices has steadily increased, each of the designs steps described in the preceding paragraphs requires additional time and resources to complete. The increased time required to complete the appropriate design tasks associated with complex devices places enormous time pressure on system and logic designers to get their designs to market. It would be highly desirable to implement a method and associated circuitry that would enable designers to verify manageable portions of their designs at early stages of the design cycle.

SUMMARY OF THE INVENTION

The problems identified above are in large part addressed by an ASIC design methodology in which portions of the ASIC are implemented in silicon or other suitable semiconductor technology at an early stage in the design flow through the use of a series of interim devices. The invention provides a method in which additional portions or subsystems of the integrated circuit are incorporated into successive versions of the interim device. In this manner, the invention provides for the gradual incorporation of a plurality of architectural subsystems into the integrated device such that the synthesis and verification of each iteration is manageable. In the preferred embodiment, this design method is facilitated by incorporating a programmable portion into the design flow of each interim device such that each interim device includes a custom portion into which the subsystems that have been implemented in silicon are fabricated and a programmable portion. The programmable portion is useful in permitting the designer to make modifications to the subsystems implemented in the custom portion or to simulate the subsystems of the target device that have yet to be implemented in the custom portion. Utilizing this technique, the present invention discloses a method of designing an ASIC that permits the designer to implement relatively small pieces of the target device independently such that, at any stage in the design, some subsystems of the target device will be defined at the gate level while other subsystems will be defined at the behavioral level.

Accordingly, it is an object of the invention to introduce a design methodology that permits a designer to verify portions of a design in silicon in gradual stages thereby increasing the probability of detecting design flaws at the earliest possible point in the design process. It is a further object of the invention to reduce the design cycle time for a complex ASIC by breaking the synthesis, layout, and verification tasks into modular units associated with the various subsystems of the target device. It is a further object of this invention to provide the designer with a method of gradually implementing pieces of a design in modular and gradual increments. It is still a further object of the invention to provide a relatively inexpensive and simple method by which designer can accomplish the gradual implementation of a complex ASIC design.

Broadly speaking, the present invention contemplates an integrated circuit comprised of a customized circuit portion and a programmable logic portion that is interfaced to the customized circuit. The custom circuit and the programmable circuit are fabricated on a common semiconductor substrate to achieve maximum cost savings and performance advantages over implementations in which an external PLD or other programmable device is interfaced to a custom circuit. Suitably, the customized circuit is designed with an ASIC design flow to optimize the performance, power consumption, and size of the customized circuit. In the presently preferred embodiment, the programmable circuit comprises a plurality of programmable logic cells suitably generated by, in one embodiment, a PLD compiler. Ideally, the relative size and placement of said PLD with respect to said customized circuit are selectable during a design phase of said integrated circuit. This provides flexibility in determining how much of an interim device need be devoted to programmable circuitry. Presumably, during earlier stages of the design process, a larger percentage of the device will be devoted to the programmable portion. As the product definition matures, subsequent interim devices contemplated herein require less programmable logic.

The present invention still further contemplates a method of producing an interim integrated circuit for use in an ASIC design process. The process includes defining multiple subsystems of said ASIC and, thereafter, designing a custom circuit for at least one of said subsystems. An appropriate size, relative to said custom circuit, is then selected for a programmable circuit to be interfaced to said custom circuit. A design for said programmable circuit is then generated and integrated with said programmable circuit design to produce an integrated design. The integrated design is then implemented in a semiconductor substrate to produce a single device incorporating the programmable section and the custom ASIC design. Preferably, the step of designing said custom circuit is accomplished with an ASIC design flow such that the custom circuit is optimized for performance, power consumption, and size. In the preferred embodiment, the step of generating said programmable circuit design comprises generating a plurality of programmable logic cells with a PLD compiler. The PLD compiler preferably generates files representative of the programmable logic cells. These files are integrated into the of said programmable circuit design flow to produce the integrated circuit. In the preferred embodiment, the implementation of the integrated design is accomplished with a semiconductor technology utilizing a silicon substrate.

The present invention still further contemplates, a method of fabricating an ASIC with an embedded PLD. A design for a custom ASIC circuit is generated and an appropriate sizing and placement for a PLD relative to said ASIC circuit is selected. Based upon the selected sizing and placement, a programmable logic cell design is generated and integrated with the ASIC circuit design to produce an integrated design. The integrated design is then implemented on a single semiconductor device. The generation of the programmable logic cell design is preferably performed with a PLD compiler. Ideally, the PLD compiler generates files representative of said PLD and, thereafter, the files are incorporated into the flow for the design of said custom ASIC circuit. The selected sizing and placement of the programmable section is ideally reflective of a stage of completion of said ASIC circuit, with less programmable circuitry being required in later stages of the design.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Figure 2:
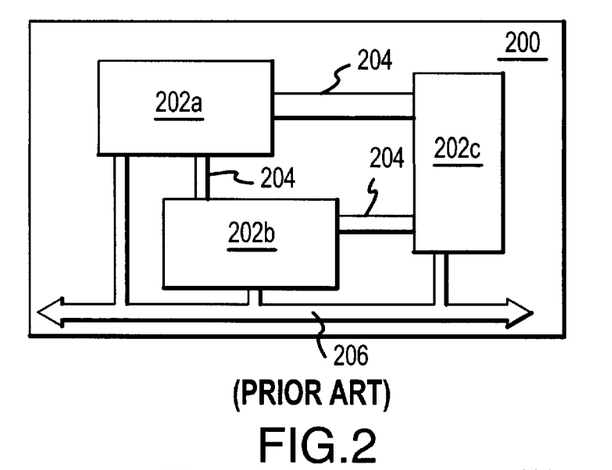
FIG. 2 is a simplified block diagram of an application specific integrated circuit comprised of a plurality of functional subsystems.

Turning now to the drawings, FIG. 2 is a block diagram of an application specific integrated circuit (ASIC) 200 according to the present invention. As shown in FIG. 2, ASIC 200 comprises a plurality of functional subsystems 202a, 202b, and 202c (collectively referred to as subsystems 200). Each of the subsystems 202 is interconnected over appropriate interconnections 204 and interfaced to the external world through and I/O bus 206 that is typically connected to input/output pins of the package that contains ASIC 200. Although FIG. 2 depicts three individual subsystems 202, it will be readily appreciated that ASIC 200 may comprise a larger number of functional subsystems. Those familiar with the market for ASICs will appreciate that time-to-market, which represents the amount of type a semiconductor manufacturer has to develop a product from inception to working silicon and volume production, has decreased to less than a year. The rapid evolution of hardware and technology reduces the profitable lifetime of typical semiconductor products thereby increasing the pressure on semiconductor manufacturers to decrease their design cycle times. Significantly decreasing design cycle times, a monumental challenge in itself, is made yet more difficult by the rate at which semiconductor technology has improved. More specifically, improvements in ASIC technology have resulted in a dramatic explosion in the number of useable gates available to systems and logic designers. This rapid increase in the number of available gates has not, unfortunately, been accompanied by a similarly exponential improvement in the ability of electronic design automation (EDA) tools to synthesize and simulate ever increasing number of gates. Designers can not realistically expect to bring their devices to market in a realistic time frame utilizing traditional gate level design. In other words, a designers cannot start from scratch with each new design and still hope to produce the part in a time frame that is acceptable to the marketplace. To address these problems, ASIC designers are typically required to utilize existing so-called core cells comprised of complex, but fully defined circuitry. Because the circuitry of core cells is fully defined, the behavior of these cells is essentially predictable and designers can incorporate large subsystems into their designs. By enabling designers to focus their activities on proprietary circuitry and functionality surrounding the basic functional blocks, core cells are an invaluable device for decreasing design cycle times in complex ASIC designs.

Regardless of whether a give ASIC design incorporates core cells as described above, a typical ASIC 200 includes two or more subsystems 202. For purposes of this disclosure, a subsystem 202 may be thought of as a block of circuitry designed to achieve a particular function necessary to the overall operation of ASIC 200. Common examples of various types of subsystems that one might expect to encounter in the design of an ASIC include, for example, counters, digital signal processors (DSPs), processors, bus interfaces controllers, image processing units, floating point units, and a variety of peripheral functions. Each of subsystem 202 typical includes complex circuitry that is time consuming to synthesize, simulate, test, and optimize using available EDA tools. When a complex ASIC, such as ASIC 200 of FIG. 1 incorporates two or more subsystems 202, the effort required to achieve an acceptable cycle time increases dramatically. The present invention contemplates a reduction in the design cycle time by disclosing a process and associated device types that permit the designer to verify subsystems of their designs at early stages in the design and to gradually incorporate and verify additional subsystems onto the verified circuitry. This methodology permits portions of the ASIC 200 to be defined in the behavioral sense while other portions have been defined at the RTL level while still other subsystems 202 are implemented at the gate level. In this manner, the disclosed design process permits concurrent development of the various subsystems and further permits a gradual process of combing the various subsystems into an integrated whole.

Figure 3:
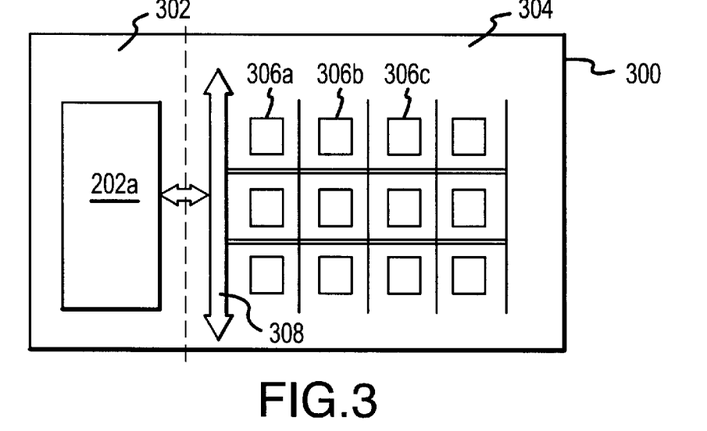
FIG. 3 is a simplified block diagram of an embodiment of an interim device according to the present invention.

More specifically, the ASIC design methodology of the present invention contemplates, in a presently preferred embodiment, an iterative process in which one or more interim devices are fabricated prior to the actual fabrication of the targeted or desired ASIC 200. Each the these interim devices includes a custom portion in which a customized implementation of one or more of the subsystems 202 of ASIC 200 is fabricated. Turning now to FIG. 2, a preferred embodiment for an interim device 300 of the type contemplated herein is depicted in simplified block diagram format. As shown in FIG. 3, interim device 300 includes a custom portion 302 in which a customized implementation of one or more of the subsystems 202 of FIG. 1 is fabricated. For purposed of this disclosure, references to custom or customized circuitry referred to circuitry that has been highly optimized in terms of performance, space, and power consumption for the particular task towards which the subsystem is directed and is presented in contrast to non-customized circuits such a circuit derived from any of a variety of programmable circuits including, for example, field programmable and mask programmable gate arrays.

In the preferred embodiment, customized subsystem 202a of interim device 300 is achieved utilizing an ASIC design flow in which a behavioral description of subsystem 202a is generated, possibly with the aid of schematic capture tools or other suitable ADE tools, and typically expressed with appropriate software code utilizing a hardware description language (HDL). This behavioral model HDL is then typically manipulated with an appropriate ADE synthesis tool to produce a register transfer level (RTL) description of subsystem 202a. The RTL description of subsystem 202a describes the subsystem in terms of various types of register, clock circuits, and surrounding logic and represents a lower level of abstraction (i.e. is less abstract), than the behavioral model. Progressing towards ever lower levels of abstraction, the next step in the ASIC design flow produces a gate level description of subsystem 2002 from the RTL description. As its name implies, a gate level description of subsystem 202a represents the subsystem in terms of interconnected logic elements such as simple AND gates, OR gates, multiplexers, shifters, and the like. From the gate level description, a netlist of subsystem 202a is produced. The netlist comprises a list of the circuit elements needed to produce the subsystem, the required interconnections between the various elements, and any constraints associated with the design or process technology. A suitable place and route tool is then utilized to generate an initial floor plan or layout database of the subsystem. The layout database provides the information necessary to manufacture suitable photomasks that will be used in the fabrication of the interim device. Those familiar with integrated circuit design will appreciate that the design flow described is designed to produce a customized circuit that is highly optimized to achieve the desired functionality of subsystems 202a while requiring the fewest number of devices, the smallest possible die size, consuming the least amount of power, and producing the highest achievable performance or speed.

In the embodiment depicted in FIG. 3, interim device 300 includes, in addition to custom portion 302, a programmable portion 304. Programmable portion 304 of interim device 300 includes any variety of programmable logic. In one embodiment, for example, the generation of the custom portion 304 of interim device 300 is integrated with the ASIC design flow described above by utilizing a tool such as a conventional PLD compiler to produce the necessary files to be incorporated in the ASIC design flow. With this design methodology, the quantity and placement of the programmable logic cells 306 within programmable portion 304 of interim device 300 can be easily controlled. It is contemplated that, at the inception of the design process, when the designer has completed little of the actual implementation of any of the subsystems 202 of ASIC 200, the programmable portion 304 of the interim devices such as interim device 300 will comprise a large percentage of total die area. As the design process proceeds, the subsequent interim devices will incorporate more and more of subsystems 202 in a custom implementation and the amount of circuitry required for programmable portion 304 will decrease.

In one embodiment of the present invention incorporating the programmable portion 304 described above into interim device 300, is interfaced to subsystems within custom portion 302 through interface 308. Programmable portion 306 may be suitably programmed to simulate the contemplated operation or functionality of the subsystems 202 of ASIC 200 that have not been implemented within custom portion 302. This embodiment allows for the designer to produce portions of the overall design in programmable logic to verify basic functionality and compatibility with the custom implemented subsystems 202 before subsystems have been finally reduced to a particular silicon implementation. In addition, the programmable portion 304 of interim device 300 may be suitably utilized to implement minor modifications or late changes to the implement subsystems within custom portion 302 of interim device 300. This flexibility free designers from the fear that last minute changes such as minor changes in a protocol associated with a custom implemented subsystem will significantly delay the verification and optimization process. Instead, such changes can be implemented through the interfaced programmable logic. This mechanism provides a superior solution than a solution in which an external or separate PLD because the single chip solution reduces the system cost and provides superior performance than a solution in which the custom implemented subsystem 202 is interfaced with an external PLD that is programmed to reflect or implement minor alterations to the subsystem.

Figure 5:
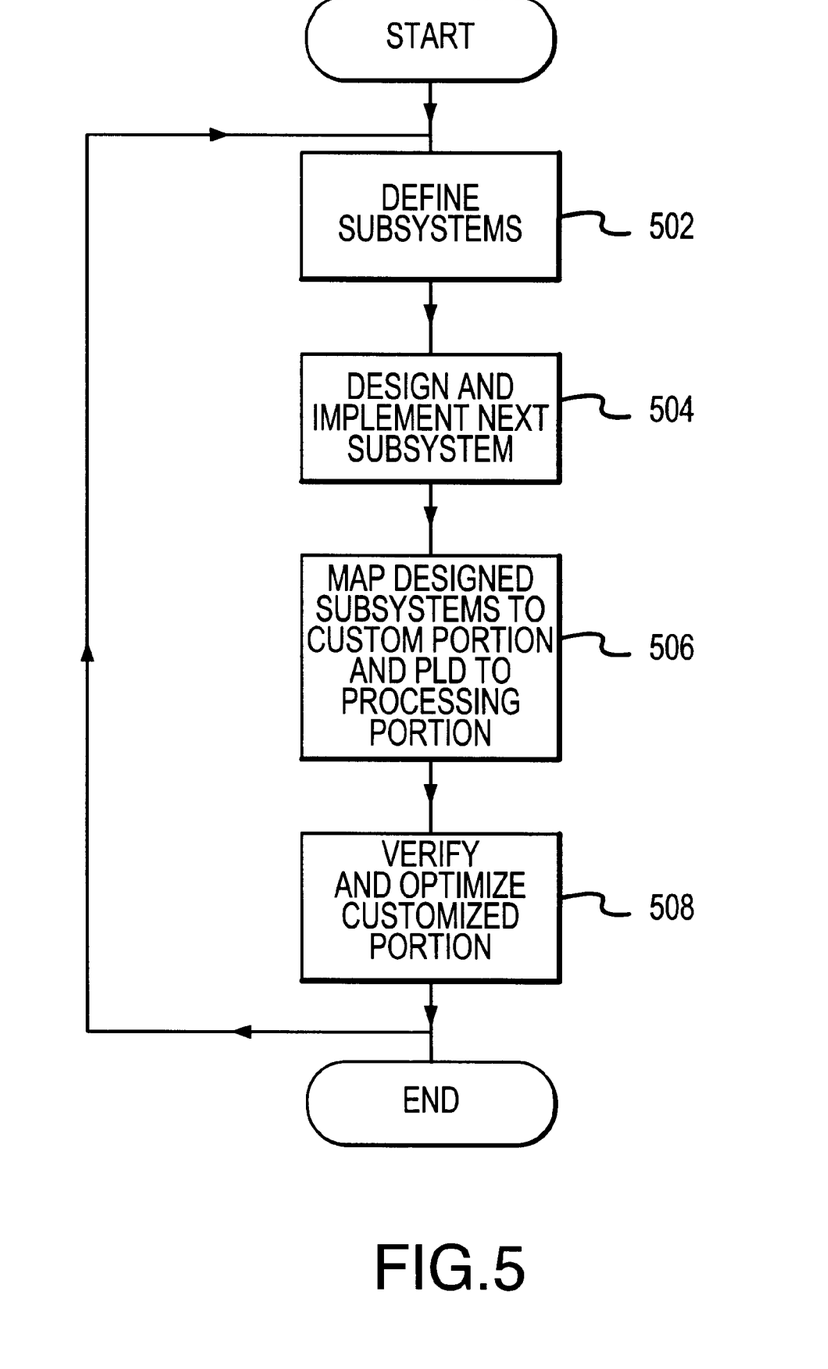
FIG. 5 is a flow diagram of an ASIC design methodology according to the present invention.

It will be appreciated that the method of the present invention contemplates an iterative process suggested by the flow diagram of FIG. 5. Initially, the component subsystems of a complex ASIC architecture are defined in step identified in FIG. 5 by reference numeral 502. A set of one or more the defined subsystems is then implemented in a custom design on a first interim device as indicated in process step 504. The custom implemented subsystem are mapped into the custom portion of the interim device while, simultaneously, programmable logic portions are mapped into a programmable section of the interim device using the integrated PLD/ASIC design flow descried above. The custom portions of the interim device can then be verified, tested, and optimized while their basic compatibility with the as yet un-implemented portions can be tested by suitable programming the programmable portions of the interim device to emulate one or more of the remaining subsystems. Verification and optimization of the custom implemented subsystems is also facilitated by the incorporation of the programmable portions onto the interim device by permitting minor changes in the customized subsystems to be implemented in the programmable logic as described previously.

Figure 4:
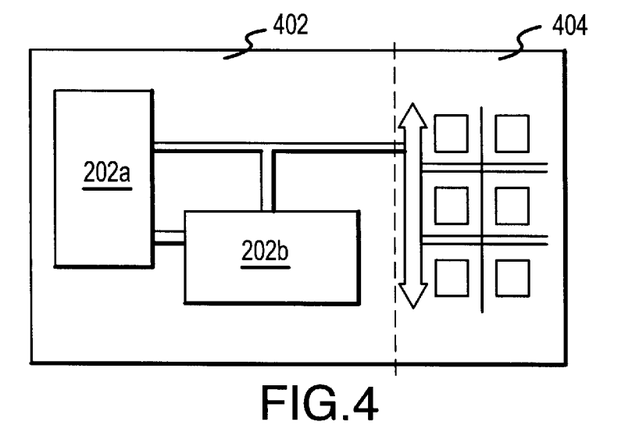
FIG. 4 is a simplified block diagram of an interim device formed subsequent to the interim device of FIG. 3.

The iterative process then repeats by incorporating as incorporating additional subsystems into the customized design flow and implementing these additional subsystems in the custom portion of a subsequent interim device. Turning to FIG. 4, a second interim device 400 is depicted. Second interim device 400, like the interim device 300 depicted in FIG. 3 includes a custom portion 402 and a programmable portion 404. Custom portion 402 of second interim device 400 includes a custom implementation of subsystems 202a (like custom portion 302 of interim device 300), but further includes a customized implementation of an additional subsystem 202b. It will therefore be appreciated that the percentage of second interim device 400 devoted to custom portion 402 is greater than the percentage of the previous interim device 300 dedicated to custom portion 302 while the percentage of second interim device 400 devoted to programmable portion 404 is less than the percentage of interim device 300 devoted to programmable portion 302. Thus, the invention contemplates a gradually design process in which an increasing percentage of the final device is brought out or implemented in silicon (or other suitable semiconductor technology) in a series of interim devices culminating, ultimately, in a final device devoted almost exclusively to customized circuitry (a small amount of programmable logic may still be desirable to facilitate entry of any last minute design fixes).

Figure 8:
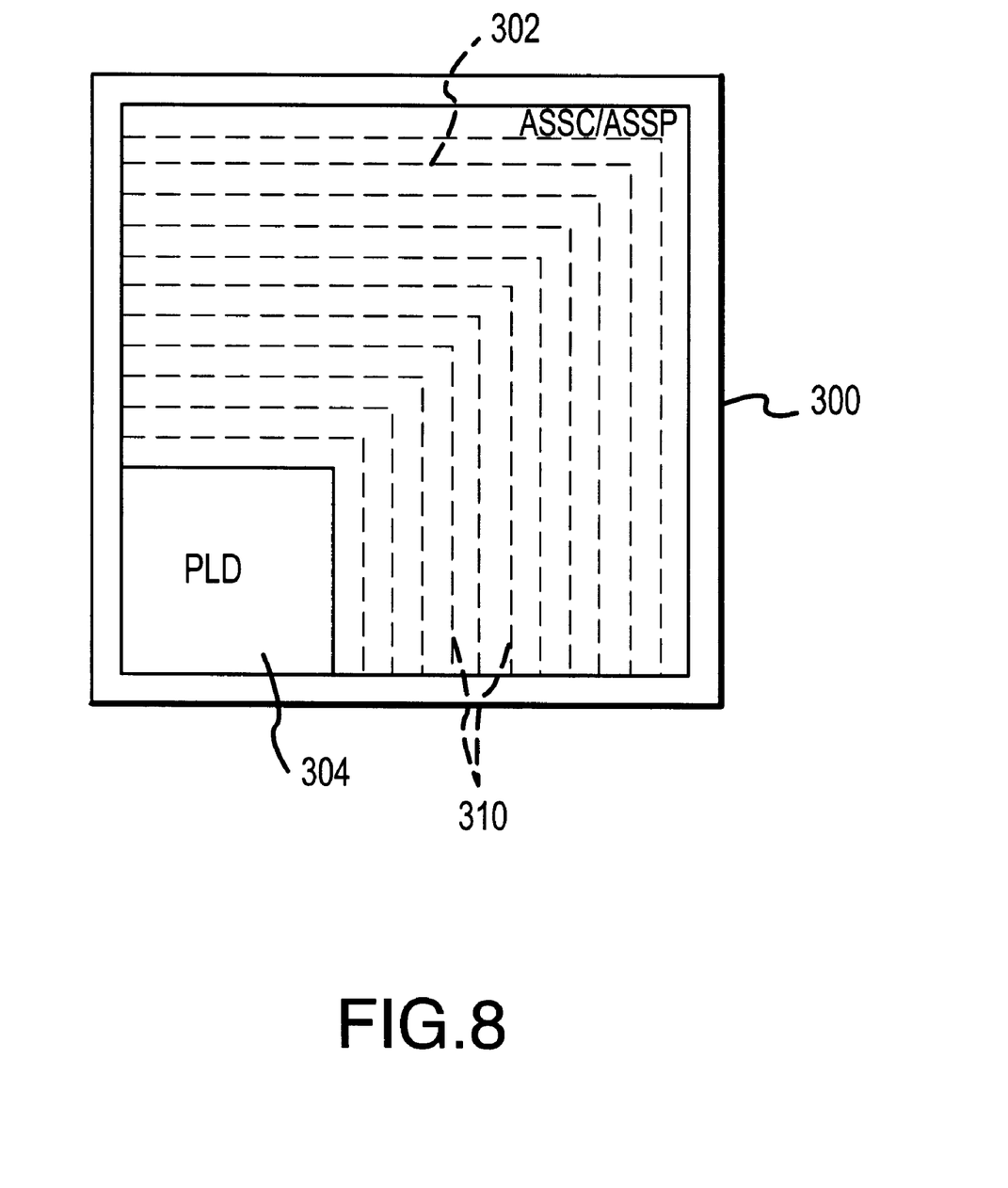
FIG. 8 is a depiction of an ASIC with a variable sized embedded PLD section according to the present invention.

Turning momentarily to FIG. 8, an alternative depiction of interim device 300 is presented to emphasize the variable sizing and placement of the programmable portion 304 with respect to custom portion 302. The dashed lines 310 represent alternative available boundaries of the programmable section 304. The ability to select the appropriate sizing and placement of the programmable section 304 with interim device 300 gives flexibility to the design process. The relative sizing of the programmable section is intended to be indicative of the maturity of the design as discussed above. Programmable logic section 304 of the embodiment of interim device 300 shown in FIG. 8 includes a conventional PLD architecture as indicated. The particular implementation of the PLD is less critical than the ability to control the sizing and placement of the programmable section 304, which enables the designer to optimize the PLD as a tool for verifying the custom portion 302 of the interim device. It will be appreciated by those familiar with arrangements in which an external PLD is coupled to a custom circuit via a breadboard or other similar development tool that the integration of the programmable section and the custom section in a single chip provides both cost savings and performance advantages over multiple chip solutions. Typically the integrated PLD/ASIC device is fabricated on a monolithic single crystal semiconductor substrate such as silicon using well known semiconductor processing technology.

Figure 6:
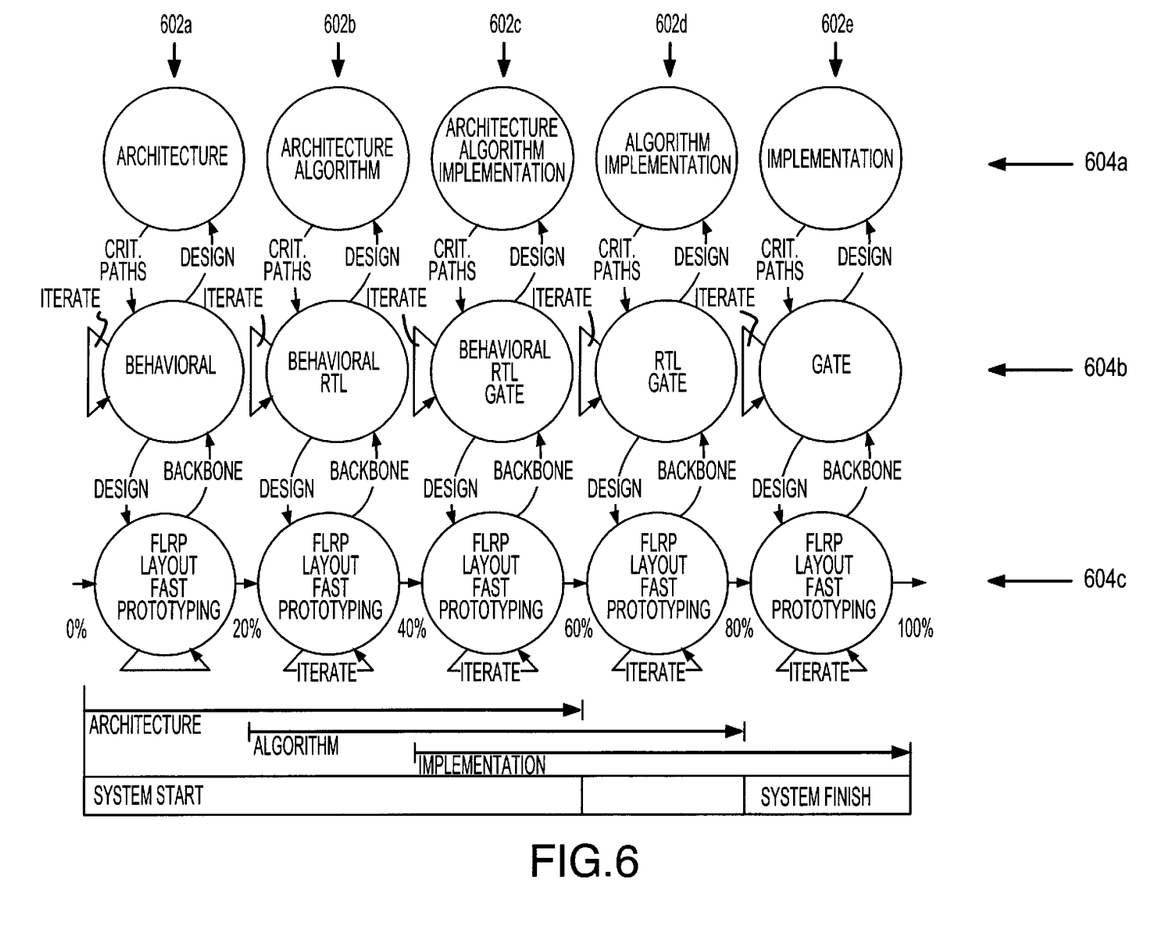
FIG. 6 is a idealized representation of a preferred embodiment of an ASIC design flow according to the present invention.

Turning to FIG. 6, a more detailed representation of a design flow in accordance with the present invention is presented. In the depiction of FIG. 6, the design flow is presented in two dimensions. Each successive column 602 in the flow represents a subsequent phase in the design flow, with the column 602a representing the earliest phase, at which little if any of the ASIC architecture has been fully implemented and the left most column 602e representing the final phase at which substantially all of the contemplated ASIC has been implemented. Within each phase 602 of the design, moving from the top row 604a to the bottom row 604c, EDA tools are utilized to produce behavioral, RTL, and gate level descriptions of various subsystems of the ASIC, and fast prototyping methods are employed to produce a succession of interim devices suitable for verifying the silicon implementation of various subsystems of the design. This process represents a significant improvement over conventional, serial design methodology in which the silicon verification of each of the various subsystems must wait until the entire device has finalized and implemented. The depiction in FIG. 6 illustrates how, with the defined methodology, various portions of the ASIC exist at various levels of definition during the design process, with some subsystems defined down to the gate level while others are defined only at the behavioral level. Thus, instead of a conventional process in which the architecture is defined, then an appropriate algorithm is generated, followed finally by an implementation of the entire algorithm, the present process contemplates that portions of the layout will be proceeding concurrently with the architectural definition of other subsystems.

Figure 7:
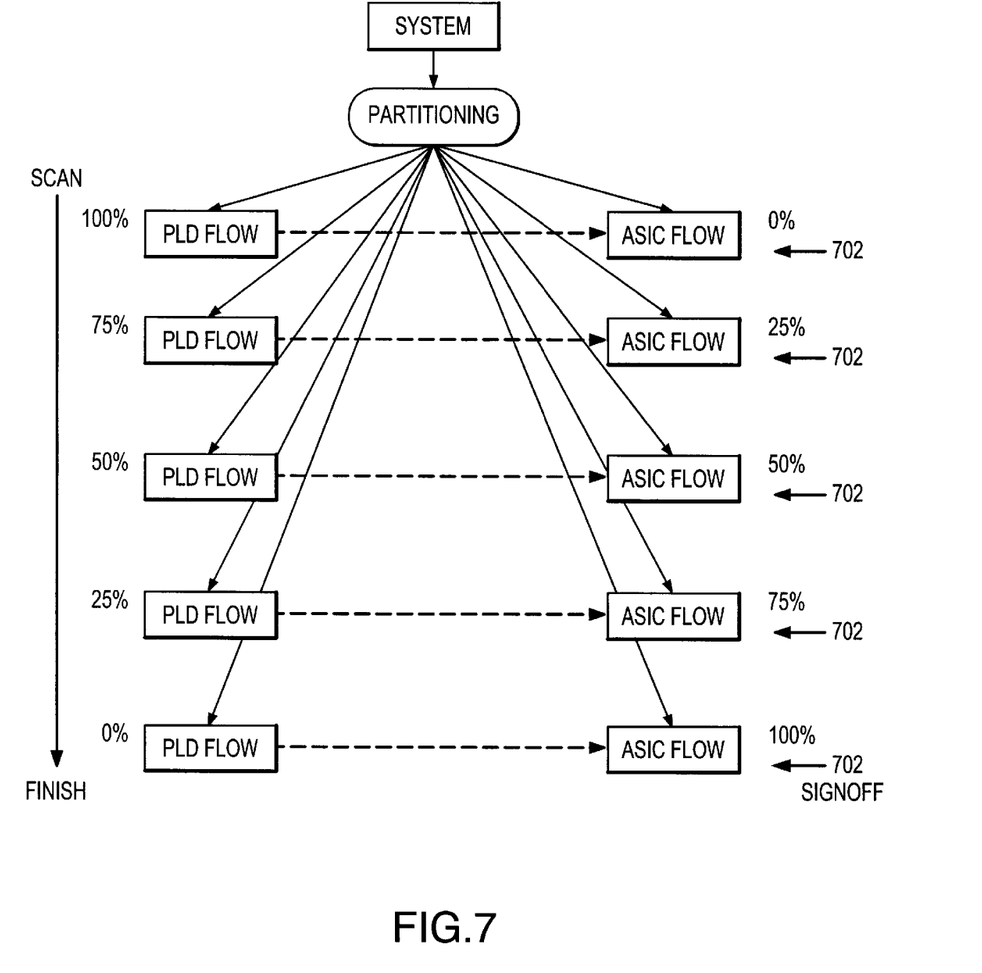
FIG. 7 is a diagram depicting the integration of a PLD design flow with a conventional ASIC design flow according to the present invention.

Turning to FIG. 7, a diagram is presented which highlights the integration of the PLD design flow with the ASIC flow to permit the concurrent design method contemplated herein. At each stage 702 of the process, portions of the design are mapped into a customized portion of the interim device using an ASIC design flow while the remaining portions of the design are mapped into programmable logic utilizing a PLD flow. At each stage a PLD compiler or other suitable generation tool produces the files that are incorporated into the customized ASIC flow thereby permitting a relatively painless integration of the programmable portions with the customized portions of the process. The diagram of FIG. 7 further highlights the gradual evolution of the interim devices from essentially full PLD in the early stages of the process to full custom at the tail end of the process when the design can be signed off.

It will be apparent to those skilled in the art having the benefit of this disclosure that the present invention contemplates an improved methodology for implementing a complex ASIC design. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. An integrated circuit comprising:
   a customized circuit; and
   a programmable circuit interfaced to said customized circuit, wherein said customized circuit and said programmable circuit are fabricated on a common semiconductor substrate;
   wherein said integrated circuit is an interim circuit in a series of interim circuits produced by a design flow and wherein a relative size and placement of said programmable circuit with respect to said customized circuit is indicative of a stage in the design flow.

2. The integrated circuit of claim 1, wherein said customized circuit is designed with an ASIC design flow to optimize performance, power consumption, and size of said customized circuit.

3. The integrated circuit of claim 1, wherein said programmable circuit comprises a plurality of programmable logic cells.

4. The integrated circuit of claim 3, wherein said plurality of programmable logic cells are generated by a PLD compiler.

5. The integrated circuit of claim 1, wherein a relative size and placement of said programmable circuit with respect to said customized circuit are selectable.

6. A method of producing an interim integrated circuit for use in an ASIC design process, said comprising:

defining multiple subsystems of said ASIC;

designing a custom circuit for at least one of said subsystems, wherein said custom circuit includes at least one of said multiple subsystems that was implemented in a programmable circuit of a prior interim device in said design process;

selecting an appropriate size, relative to said custom circuit, for a programmable circuit to be interfaced to said custom circuit;

generating a design for said programmable circuit and integrating said programmable circuit design with said custom circuit design to produce an integrated design; and implementing said integrated design in a semiconductor substrate.

7. The method of claim 6, wherein the step of designing said custom circuit is accomplished with an ASIC design flow whereby said custom circuit is optimized for performance, power consumption, and size.

8. The method of claim 6, wherein the step of generating said programmable circuit design comprises generating a plurality of programmable logic cells with a PLD compiler.

9. The method of claim 8, wherein said PLD compiler generates files representative of said plurality of programmable logic cells and further wherein said integrating of said programmable circuit design with said custom circuit design comprises incorporating said generated files into an ASIC design flow.

10. The method of claim 6, wherein said semiconductor substrate comprises single crystal silicon.

11. A method of fabricating an interim device comprising an ASIC with an embedded PLD, said method comprising:

generating a design for a custom ASIC circuit;

selecting an appropriate sizing for a PLD relative to said ASIC circuit wherein said sizing for said PLD decreases for each in a succession of interim devices as portions of a prior interim device implemented in a PLD of said prior interim device are implemented in said ASIC circuit of the current interim device;

generating a design for a plurality of programmable logic cells;

integrating said programmable logic cell design with said ASIC circuit design to produce an integrated design; and producing said integrated design on a single semiconductor device.

12. The method of claim 11, wherein the step of generating said programmable logic cell design is accomplished with a PLD compiler.

13. The method of claim 12, wherein said PLD compiler generates files representative of said PLD and further wherein said files are incorporated into the step of generating the design for said custom ASIC circuit.

14. The method of claim 11, wherein said appropriate sizing is indicative of the maturity of said interim device.

15. The method of claim 11, wherein said single semiconductor device comprises a single crystal silicon substrate.

* * * * *